(12) United States Patent
Holce et al.

(10) Patent No.: US 8,094,425 B2
(45) Date of Patent: *Jan. 10, 2012

(54) COMBINATION CURRENT SENSOR AND RELAY

(75) Inventors: Kent J. Holce, Lake Oswego, OR (US); Roger S. Cota, Vancouver, WA (US)

(73) Assignee: Veris Industries, LLC, Portland, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/982,647

(22) Filed: Dec. 30, 2010

(65) Prior Publication Data

US 2011/0096450 A1    Apr. 28, 2011

Related U.S. Application Data

(63) Continuation of application No. 12/383,231, filed on Mar. 20, 2009, now Pat. No. 7,889,473, which is a continuation of application No. 12/070,606, filed on Feb. 19, 2008, now Pat. No. 7,548,404, which is a continuation of application No. 11/732,659, filed on Apr. 3, 2007, now Pat. No. 7,362,556, which is a continuation of application No. 11/187,053, filed on Jul. 21, 2005, now Pat. No. 7,203,047, which is a continuation of application No. 10/902,395, filed on Jul. 28, 2004, now Pat. No. 6,950,292, which is a continuation of application No. 10/772,187, filed on Feb. 3, 2004, now Pat. No. 6,888,712, which is a continuation of application No. 10/052,248, filed on Jan. 18, 2002, now Pat. No. 6,724,600, which is a continuation of application No. 09/748,084, filed on Dec. 20, 2000, now Pat. No. 6,377,430, which is a continuation of application No. 09/438,216, filed on Nov. 12, 1999, now Pat. No. 6,219,216, which is a continuation of application No. 09/264,367, filed on Mar. 8, 1999, now abandoned, which is a continuation of application No. 09/057,730, filed on Apr. 8, 1998, now Pat. No. 6,005,760, which is a continuation of application No. 08/500,522, filed on Jul. 11, 1995, now Pat. No. 5,808,846.

(51) Int. Cl.
    *H02H 7/00* (2006.01)
(52) U.S. Cl. .................................................. 361/93.1
(58) Field of Classification Search ............... 361/93.1
    See application file for complete search history.

(56) References Cited

U.S. PATENT DOCUMENTS 7,889,473 B2 * 2/2011 Holce et al. ............... 361/93.1

* cited by examiner

*Primary Examiner* — Stephen W Jackson
(74) *Attorney, Agent, or Firm* — Chernoff Vilhauer McClung & Stenzel, LLP

(57) ABSTRACT

A protection device for monitoring current in a power cable to an electrical device and for controlling a remotely located starter for the electrical device in response to a system controller. The device includes a transformer magnetically linked with the power cable to produce a voltage signal in response to the presence of a changing current within the power cable. An input circuit located in a single housing together with the transformer is electrically connected to the transformer so as to receive the voltage signal. The input circuit produces, in response to the voltage signal, either a first signal or a first circuit condition at the output terminal of the input circuit, representative of the changing current in the power cable. A switch circuit also in the same container with the transformer has a terminal for sensing either a second signal or a second circuit condition of the remotely located system controller. The switch circuit has a second terminal to provide either a third signal or a third circuit condition effective to control the starter, in response to sensing one of the second signal and the second circuit condition. All of the transformer, the input circuit, and the switch circuit are located in a single unitary package which is easily mounted and adjusted to a desired position.

19 Claims, 7 Drawing Sheets

COMBINATION CURRENT SENSOR AND RELAY

CROSS-REFERENCE TO RELATED APPLICATIONS

This application is a continuation of U.S. patent application Ser. No. 12/383,231, filed Mar. 20, 2009, now U.S. Pat. No. 7,889,473; which is a continuation of U.S. patent application Ser. No. 12/070,606, filed Feb. 19, 2008, now U.S. Pat. No. 7,548,404, which is a continuation of U.S. patent application Ser. No. 11/732,659, filed Apr. 3, 2007, now U.S. Pat. No. 7,362,556; which is a continuation of U.S. patent application Ser. No. 11/187,053, filed Jul. 21, 2005, now U.S. Pat. No. 7,203,047; which is a continuation of U.S. patent application Ser. No. 10/902,395, filed Jul. 28, 2004, now U.S. Pat. No. 6,950,292; which is a continuation of U.S. patent application Ser. No. 10/772,187, filed Feb. 3, 2004, now U.S. Pat. No. 6,888,712; which is a continuation of U.S. patent application Ser. No. 10/052,248, filed Jan. 18, 2002, now U.S. Pat. No. 6,724,600; which is a continuation of U.S. patent application Ser. No. 09/748,084, filed Dec. 20, 2000, now U.S. Pat. No. 6,377,430; which is a continuation of U.S. patent application Ser. No. 09/438,216, filed Nov. 12, 1999, now U.S. Pat. No. 6,219,216; which is a continuation of U.S. patent application Ser. No. 09/264,367, filed Mar. 8, 1999, now abandoned; which is a continuation of U.S. patent application Ser. No. 09/057,730, filed Apr. 8, 1998, now U.S. Pat. No. 6,005,760; which is a continuation of U.S. patent application Ser. No. 08/500,522, filed Jul. 11, 1995, now U.S. Pat. No. 5,808,846.

BACKGROUND OF THE INVENTION

The present invention relates to a single protection device, including a transformer, an input circuit, and a switch circuit, suitable for addition to an electrical power system that includes a control panel electrically interconnected with a starter to control an electrical device. It is desirable to monitor the performance of devices such as electric motors and to control them through remotely located control panels. While this has long been possible, it has been costly to install the required sensors and controls.

Springer, U.S. Pat. No. 4,885,655 discloses an integrated capacitor-start, induction-run electric motor starter and protection circuit specifically suitable for a water pump. The circuit requires physical electrical connection to the power cables to sense the phase angle between the voltage and the current applied to the motor to indicate when it is operating without a load. When such a condition occurs, the circuit triggers an activator coil to de-energize the motor by opening a switch member. The integrated starter and protection circuit is suitable only for induction machines.

Libert, U.S. Pat. No. 4,887,018, discloses a start-up circuit for gradually starting a multiphase motor and which also includes detector circuits for detecting various fault conditions and for disconnecting power from the motor in response to fault conditions. Integrating the motor starter and protection circuit into one device makes it unsuitable for addition to existing power systems to detect fault conditions within power cables.

Flückiger, U.S. Pat. No. 5,359,273, discloses a load control circuit for controlling the load of an asynchronous motor. The circuit includes a pair of capacitors, one of which can be connected in parallel with the other by a switch. Control over whether one or two capacitors is supplied as a load to the motor is provided by comparing signals from a current sensor and a voltage sensor in a comparator. Depending upon the relative size of the compared signals, the switch is turned off or on.

Domshy, et al., U.S. Pat. No. 3,593,078, discloses a starting and operating control circuit that includes voltage sensors and current sensors to start a motor and limit the power supplied to it.

One design of a starter includes an integrated starter and protection circuit to detect fault conditions of an associated electrical device and, in response to detecting a fault condition, disable the electrical device. When a starter with an integrated starter and protection circuit is used to control devices in an environment in which the electrical devices are not dependent upon other machines, or their operation does not impact other devices, the inclusion of the integrated starter and protection circuit is an effective way to protect the associated electrical device. However, when a starter including such an integrated protection circuit is used in a system where the associated electrical device is interdependent with other electrical devices, use of such a starter to independently enable and disable the electrical device may result in devastating effects to the entire system. In other words, where several electrical devices combine to produce a result, as in systems that include a computerized control panel or system controller, it is desirable for the control panel or system controller to maintain control over the status of the electrical devices to minimize potential problems.

However, many starter designs do not include an integrated protection circuit and also include no-fault detection. To provide fault detection for electrical devices, a current sensor surrounding the power cable to the electrical device may be used to sense the electrical load current. The current sensor may be electrically interconnected between a control panel and the power cable to provide a signal to the control panel representative of the current within the power cable. Suitable current sensors are known, such as the current sensor sold by Veris Industries, Inc., under the trademark HAWKEYE 700. It is desirable to locate such a current sensor within a housing where a starter for the electrical device is located.

A relay is typically electrically interconnected between a remotely located control panel and a starter to receive a control signal from the control panel and in response to provide an indication to the starter. Like the current sensor, such a relay may be located within a starter housing.

The relay and current sensor in the past have been separate individual devices, each requiring a mounting location that may not be available within the starter housing due to limited space. Additionally, it takes additional time to install two separate devices and requires stocking two separate replacement parts for use in the event of device failure. Also, troubleshooting likely requires the inspection of both devices.

What is desired, therefore, is a protection device that is suitable for addition to existing electrical systems that operate in an environment including a control panel and a starter controlling the operation of an associated electrical device. The protection device should be compact, inexpensive, and fast to install.

BRIEF SUMMARY OF THE INVENTION

The present invention overcomes the aforementioned drawbacks and shortcomings of the prior art by providing a protection device for monitoring current in a power cable to an electrical device and for controlling a starter for the electrical device in response to a remotely located system controller. The protection device includes a transformer magnetically linked with the power cable connected to the electrical device. The transformer produces a voltage signal in response to the presence of a changing current within the power cable. An input circuit located proximate to the transformer has an output terminal and is electrically connected to the transformer so as to receive the voltage signal. The input circuit produces, in response to receiving the voltage signal, one of a first signal representative of the changing current and a first circuit condition at the output terminal of the input circuit representative of the changing current in the power cable. A switch circuit has a first terminal for sensing one of a second signal and a second circuit condition of the remotely located system controller. The switch circuit has a second terminal to provide one of a third signal or a third circuit condition, in response to sensing one of the second signal and the second circuit condition. The third signal and the third circuit condition is effective to control the starter when the starter is electrically connected thereto. All of the transformer, the input circuit, and the switch circuit are located in a single unitary package.

By locating the sensor circuit, which is a combination of the transformer and the input circuit, and the switch circuit proximate to one another within the single package, significant advantages are realized. Due to the limited available space within a starter housing, the single package is more desirable. The expense of manufacturing a single package is frequently less than manufacturing two separate packages. The time required to install both the switch circuit and the sensor circuit is reduced by only requiring installation of one combined package. A reduction in the number of backup parts and troubleshooting time is also realized.

In a preferred package a mounting bracket includes a slide arrangement to support the transformer so that its position can be adjusted easily to the best location with respect to the power cable.

The foregoing and other objectives, features, and advantages of the invention will be more readily understood upon consideration of the following detailed description of the invention, taken in conjunction with the accompanying drawings.

DETAILED DESCRIPTION OF PREFERRED EMBODIMENT

Figure 1:
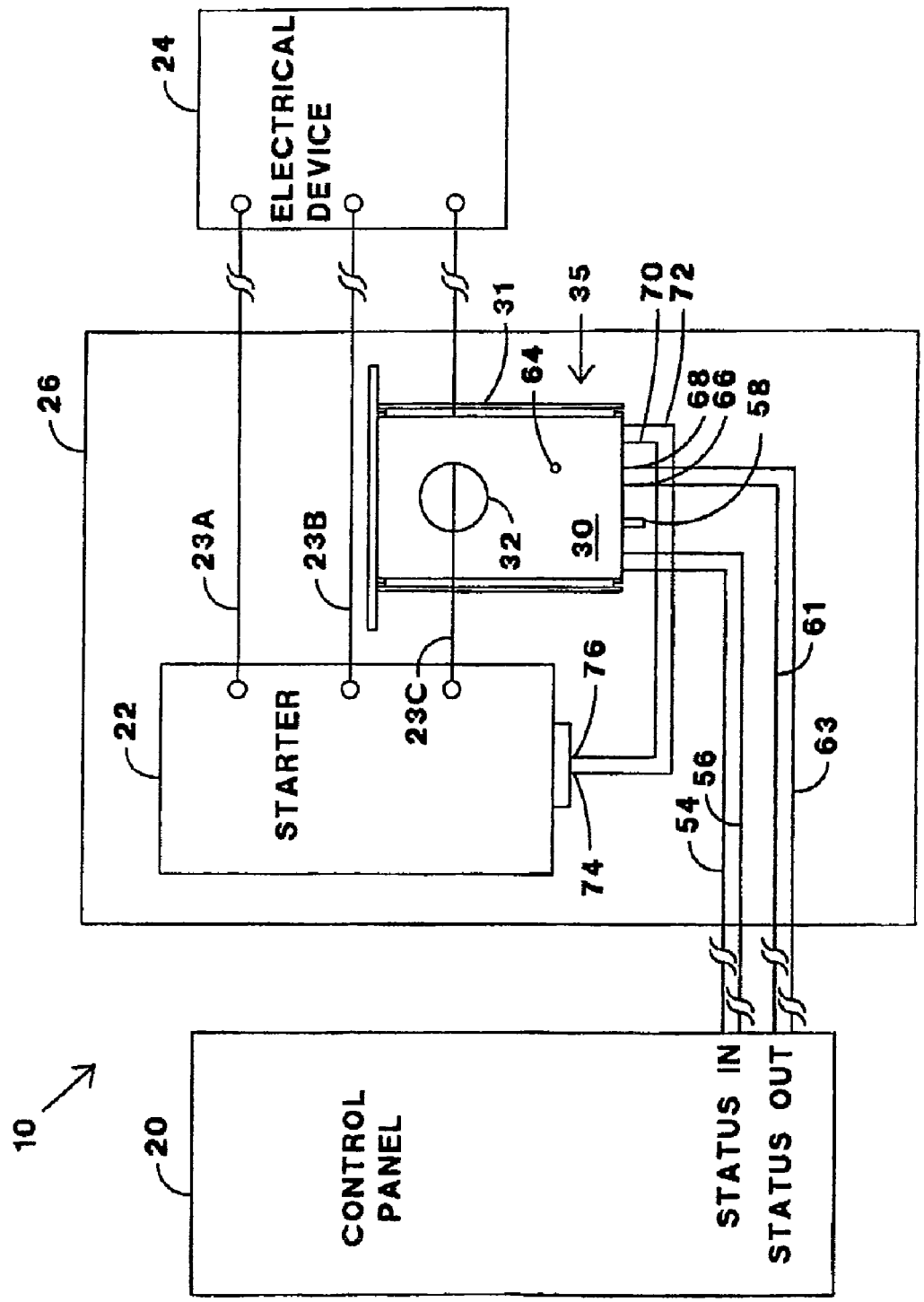
FIG. 1 is a schematic representation of an electrical system that includes a protection device according to the present invention, a control panel, and a starter controlling the operation of an associated electrical device.

Referring to FIG. 1, an electrical system 10 includes a control panel 20 that utilizes a digital computer to provide effective control of many associated electrical devices. The centralized control panel 20 determines the effects on the entire system 10, or a portion of the system 10, of enabling or disabling an electrical device. For example, such associated electrical devices may include motors, pumps, fans, valves, generators, switches, lights, etc. One type of control panel 20 is generally known as a programmable logic controller, such as those sold by Allen Bradley.

A starter 22, designed to start (energize) and stop (de-energize) remotely located electrical devices, is electrically connected to an associated electrical device 24 by three power cables 23a, 23b, and 23c. Each starter 22 is usually located within an individual starter housing 26 which is a part of a substation. Most substations are not large, so it is desirable to reduce the size of the housing 26, so as to maximize the number of housings 26 that may be located within the substation. Accordingly, the housing 26 is normally designed to be only slightly larger than the enclosed starter 22, and so there is only limited space within the housing 26 in which to place additional devices, such as protection devices.

Figure 2:
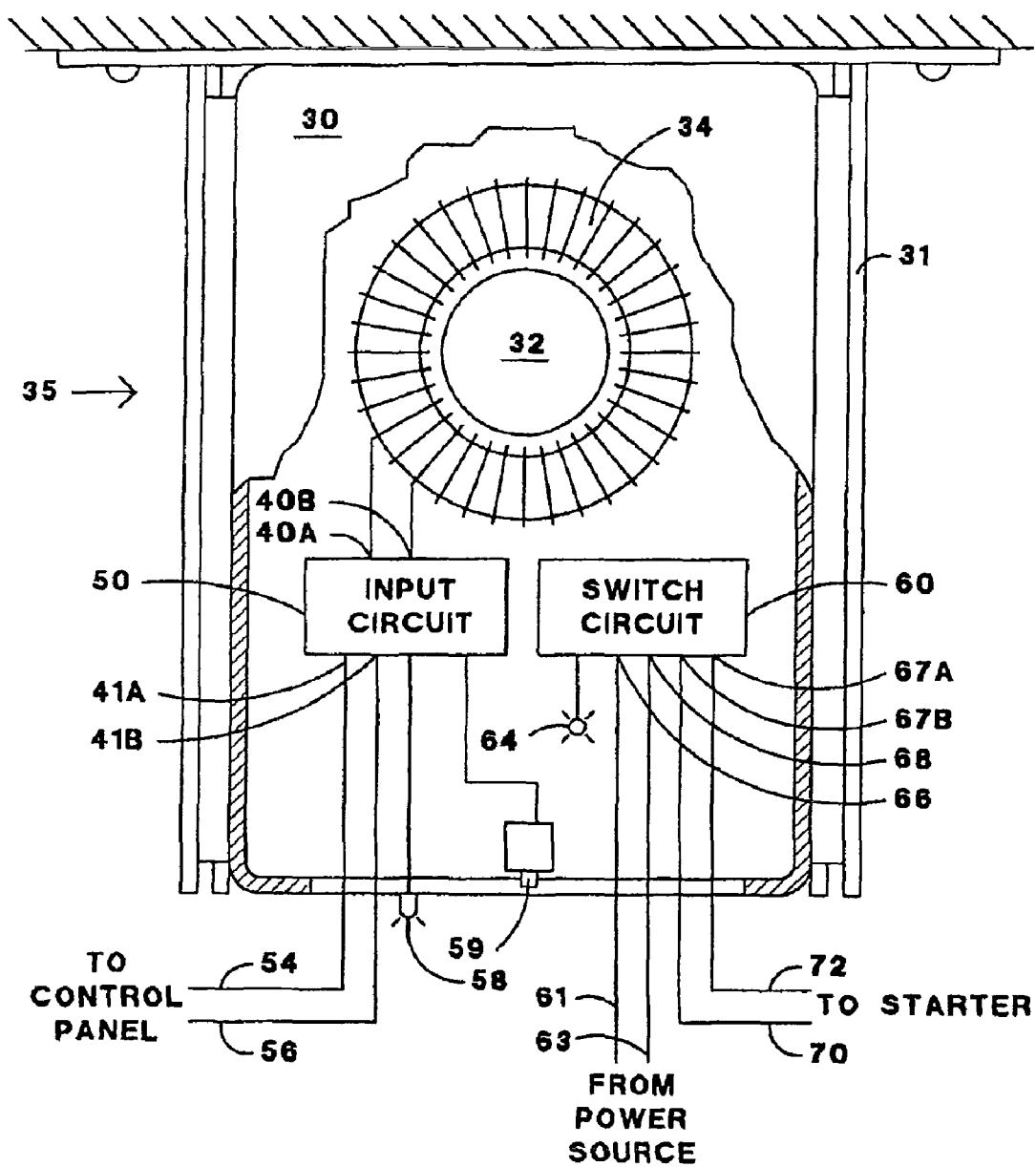
FIG. 2 is a pictorial representation of the protection device of FIG. 1, showing a transformer, an input circuit, and a switch circuit.

Referring to FIG. 2, a protection device 35 includes both a current sensor, including a transformer 34 and an input circuit 50, and a switch circuit 60 within the single package 30. The package 30 is preferably slidably mounted on a support 31 mounted within the housing 26. By placing the transformer 34, input circuit 50, and switch circuit 60 proximate to one another, within the single package 30, it is considerably easier to locate the device 35 within the limited space of the starter housing 26. Additionally, installing only the single package 30 requires less installation time than installation of separate devices to perform each of the desired functions, and the expense of manufacturing, packaging and shipping a single device is less than for two separate devices. A reduction in the number of backup parts and troubleshooting time is also realized.

The package 30 defines a central opening 32 through which the power cable 23c is routed. Surrounding the central opening 32 is a toroidal sensing transformer 34 to sense the changing current within the power cable 23c. The toroidal sensing transformer 34 is preferably a wire-wrapped magnetically permeable toroidal core, normally made of iron, encircling the respective power cable. Thus, the wire wound on the toroidal sensing transformer 34 is the secondary winding, while the power cable 23c, or a parallel shunt current divider (not shown), is the primary winding of the toroidal sensing transformer 34. Changing current in the power cable 23c induces a changing electromagnetic field around the power cable 23c, which in turn induces a magnetic flux in the magnetically permeable core. The magnetic flux in the core induces in the wire windings on the toroidal core a voltage representative of the current in the power cable. An exemplary sensing transformer has the following construction: core material made by Arnold Engineering, of Norfolk, Nebr., of 0.012 silectron, 3% silicon steel, grain oriented, with an outside diameter of 1.375 inches, an inside diameter of 1.125 inches, strip width of 0.500 inches, strip thickness of 0.012 inches, an epoxy powder coating of 0.010 to 0.030 inches thick, a nylon overcoat wound on the metal core, and a #35

AWG size wire coated with a heavy polyurethane wound 1,800 turns as a secondary winding.

Such a sensing transformer with a core of magnetically permeable material, such as iron, generates a voltage signal reasonably accurately representative of the current in the power cable over a certain normal load range. However, iron and other magnetically permeable materials have hysteresis and other nonlinear responses to changing magnetic fields that result in a nonlinear relationship between current in the power cable and the voltage signal produced in a transformer coil having such a core. The nonlinearity of such responses is especially significant with large variations in load current and frequency. To provide a more linear measurement of power, "air core" transformers have been designed using wire wrapped on a core made of material having a low magnetic permeability, such as one of plastic or nylon. Without a magnetically permeable core, however, the transformer winding generates relatively small voltage levels in response to power cable currents. An exemplary air core transformer has the following construction: core of nylon, outside diameter of 1.375 inches, inside diameter of 1.125 inches, strip width of 0.500 inches, and a #35 AWG size wire coated with a heavy polyurethane, wound 4,000 turns as a secondary winding. Examples of circuitry suitable for use with an "air core" transformer are disclosed in U.S. patent application Ser. No. 08/300,732, assigned to the same assignee, and incorporated herein by reference.

The ends of the secondary winding 40a and 40b of the transformer 34 are electrically connected to an input circuit 50. The input circuit 50 is designed to convert the voltage signal received from the transformer 34 to either a signal representative of the changing current in the power cable or a circuit condition at the output terminal 41a and 41b representative of the changing current in the power cable. The signal or circuit condition is provided to transmission lines 54 and 56 which are connected to the control panel 20. For example, the signal could be a current signal, voltage signal, or some sort of frequency modulation, amplitude modulation, or digital encoding. The circuit condition, for example, could be a short circuit, open circuit, or other suitable type of condition. The input circuit 50 can be designed and constructed in any manner, so long as it converts the voltage signal output from the transformer 34 to an appropriate corresponding signal or circuit condition. Several exemplary input circuit designs are described below. A light emitting diode 58 is electrically connected to the input circuit 50 and is illuminated when current is sensed within the power cable. A potentiometer 59 allows adjustment of a threshold level within the input circuit 50 of the sensed voltage from the transformer 34.

The use of the control panel 20 or system controller provides automated control over the electrical system 10. The control panel 20 receives the signal from the input circuit 50 or determines the circuit condition of the input circuit 50 via a pair of transmission lines 54 and 56. The control panel 20 in response to receiving the signal or determining the circuit condition of the input circuit 50 analyzes the signal or circuit condition to determine information such as power consumption, overcurrent, overvoltage, undercurrent, undervoltage, frequency, spikes, harmonics, etc. From this information the control panel 20, among other things, may determine that the electrical device 24 should be disabled or enabled. For example, if the current sensor indicates that a motor (not shown) for a pump is malfunctioning, then the control panel 20 may have that motor deactivated. If deactivation of that motor would also impact another device, such as an auger within a storage tank supplying fluids to the pump, then the control panel 20 may also deactivate the motor for the auger.

The control panel 20 is electrically connected to a switch circuit 60 by a pair of transmission lines 61 and 63. The switch circuit 60 is located proximate to the transformer 34 and input circuit 50. The switch circuit 60, transformer 34, and input circuit 50 are all enclosed within the single package 30. The package is preferably mounted within the starter housing 26.

The switch circuit 60 includes any suitable switching device, for example, a triac or a relay, as will be described below. The triac or relay is powered by a 24 volt AC or DC signal through the transmission lines 61 and 63. The power on the transmission lines 61 and 63 closes the circuit through the switch circuit 60 and maintains a short circuit between the output terminals 67a and 67b of the switch circuit 60. When power ceases to be supplied to the switch circuit 60, the output terminals 67a and 67b of the switch circuit 60 are electrically isolated from each other (open circuit). With the output terminals of the switch circuit 60 in an open circuit condition when the transmission lines 61 and 63 are not powered, a safety feature for the starter 22 is provided in the event of power failure to the control panel as will be described below. Alternatively, the switch circuit 60 could be designed to be controlled by any type of suitable signal or circuit condition.

A pair of wires 70 and 72 are connected between the output terminals 67a and 67b, respectively, of the switch circuit 60 and starter terminals 74 and 76. The starter terminals 74 and 76 permit exterior control over the operation of the starter 22. For most starters 22, when the terminals 74 and 76 are short circuited (electrically connected together) the starter 22 energizes and operates the associated electrical device 24. Alternatively, when the terminals 74 and 76 are open circuited (isolated from each other), the starter 22 de-energizes, or otherwise ceases the operation of the associated electrical device 24. Accordingly, the open or short circuited circuit conditions applied between the output terminals 67a and 67b of the switch circuit 60 connected to the wires 70 and 72 are suitable to control the starter 22. The switch circuit 60 may alternatively be constructed to provide whatever signal or circuit condition is necessary to control the particular starter 22, which may include a voltage signal, a current signal, digital signal, etc. A light emitting diode 64 is electrically connected to the switch circuit 60 and is illuminated when the transmission lines 61 and 63 are powered.

Figure 3:
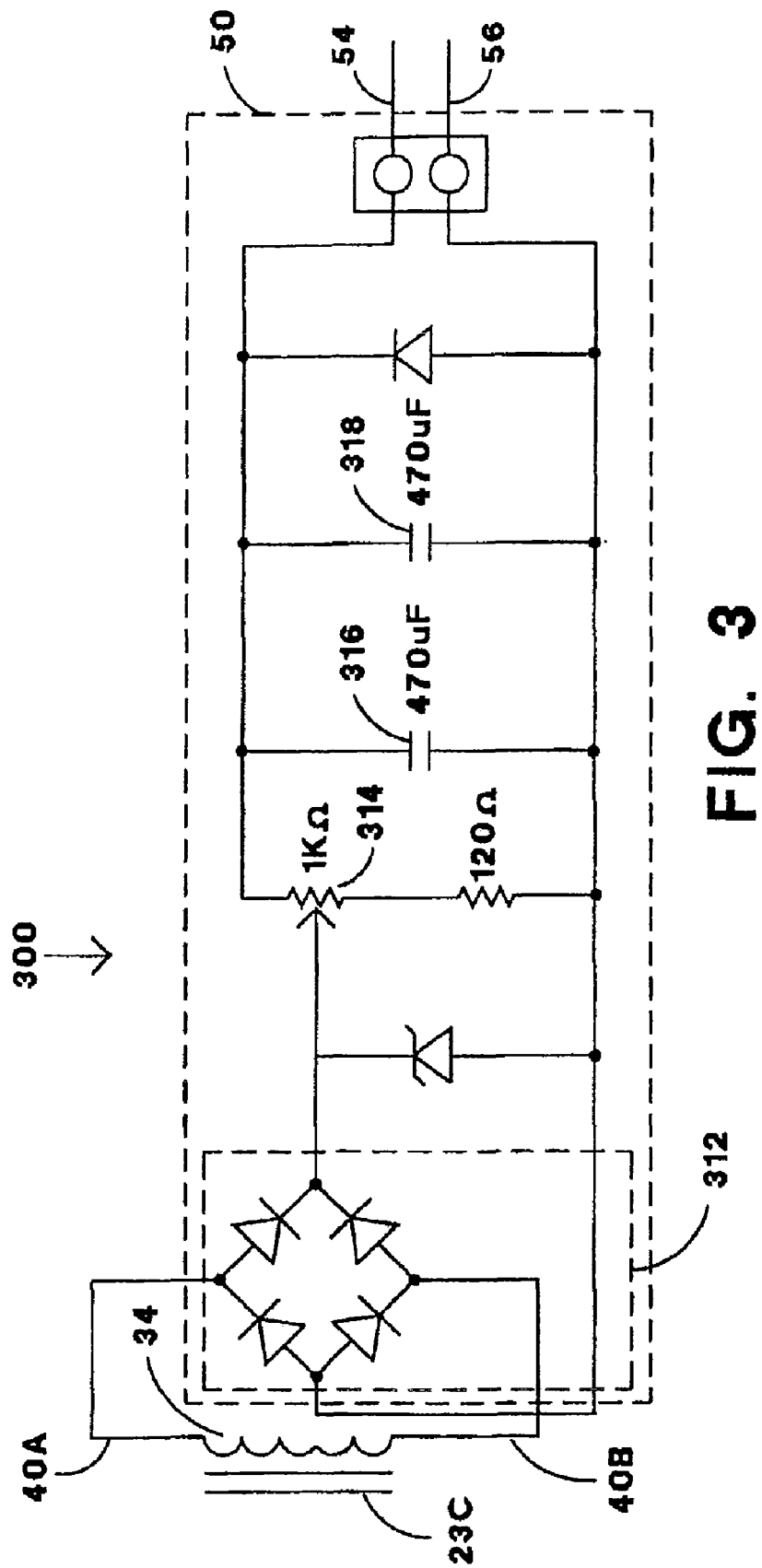
FIG. 3 is an electrical schematic diagram of a transformer and input circuit which is a portion of a first embodiment of the present invention, suitable to provide a full scale 0 volt to 5 volt output signal.

Referring to FIG. 3, an electrical schematic diagram of a current sensor 300 suitable to provide a full scale 0 volt to 5 volt output signal is shown. The transformer 34 encircles a power cable 23c, producing a voltage between the ends 40a and 40b of its secondary winding. The ends 40a and 40b of the transformer secondary winding are connected to the input circuit 50 which includes a full wave rectifier 312, connected to a variable resistance 314 and associated capacitors 316 and 318, to scale the output of the full wave rectifier 312 to the desired range. The preferred range to interface with conventional control panels 20 is 0 volts when no current within the power cable 23c is sensed to 5 volts when the maximum desired level within the power cable is sensed.

Figure 4:
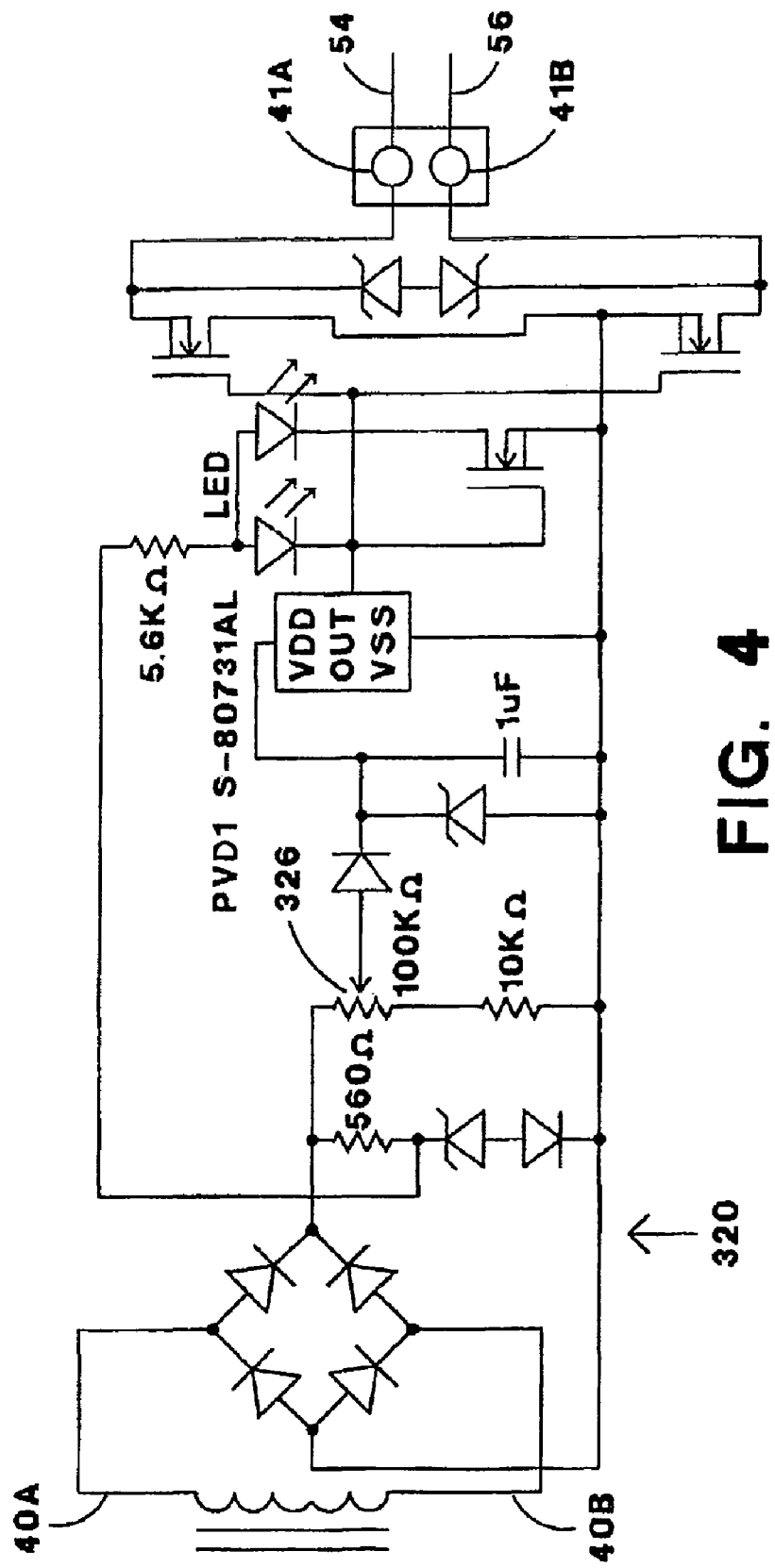
FIG. 4 is an electrical schematic diagram, of a transformer and input circuit which is a portion of a second embodiment of the present invention suitable to provide an open circuit or short circuit condition.

Referring to FIG. 4, current sensor 320 provides either an open circuit or short circuit at its output terminals 41a and 41b depending on whether the voltage signal produced in response to the current sensed by the transformer 34 surpasses a predetermined threshold level. A variable resistor 326 sets the threshold level.

Figure 5:
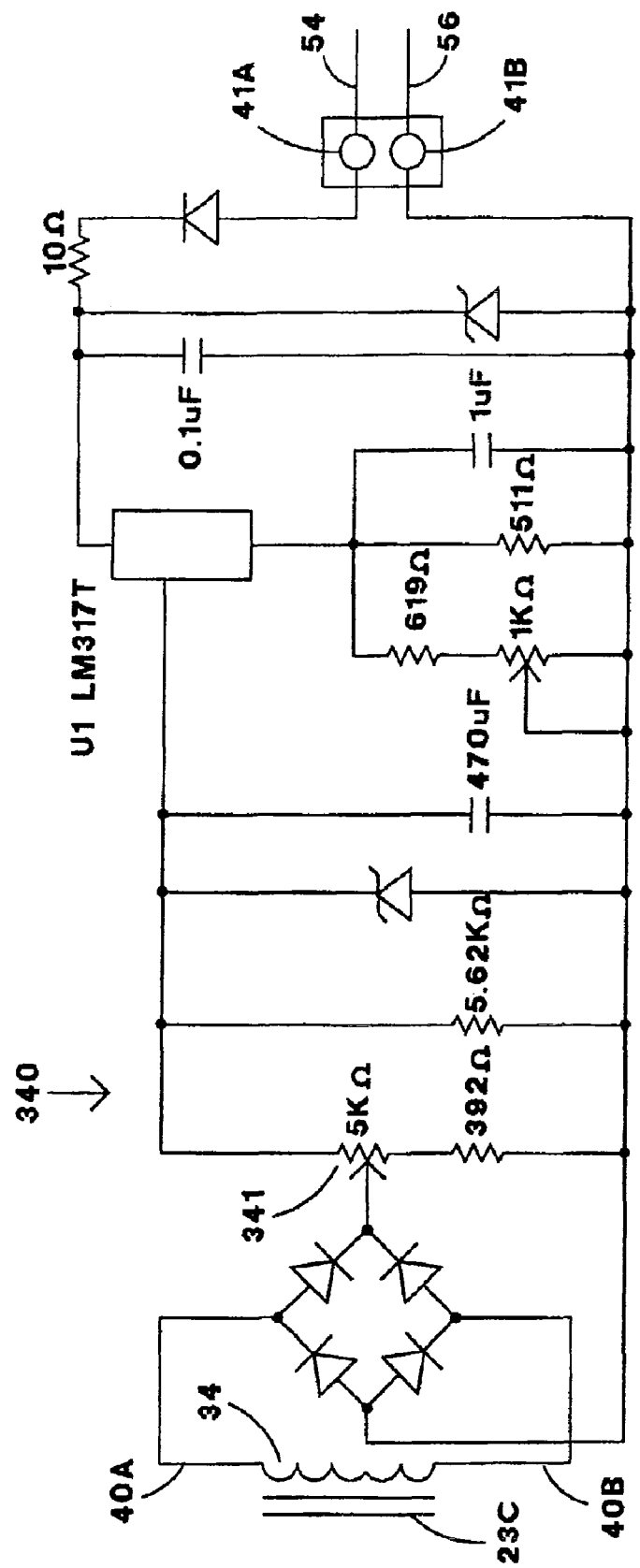
FIG. 5 is an electrical schematic diagram of a transformer and input circuit which is a portion of third embodiment of the present invention, suitable to provide a 4-20 ma output signal.

Referring to FIG. 5, current sensor 340 provides a 4-20 ma variable output signal at its output terminals 41a and 41b. When the current sensed in the power cable 23c is 0 then the sensor circuit 340 puts out a 4 ma signal. When the current sensed in the power cable 23c is equal to a desired maximum, when the variable resistor 341 is correctly set, then the sensor circuit 340 puts out a 20 ma signal.

Figure 6:
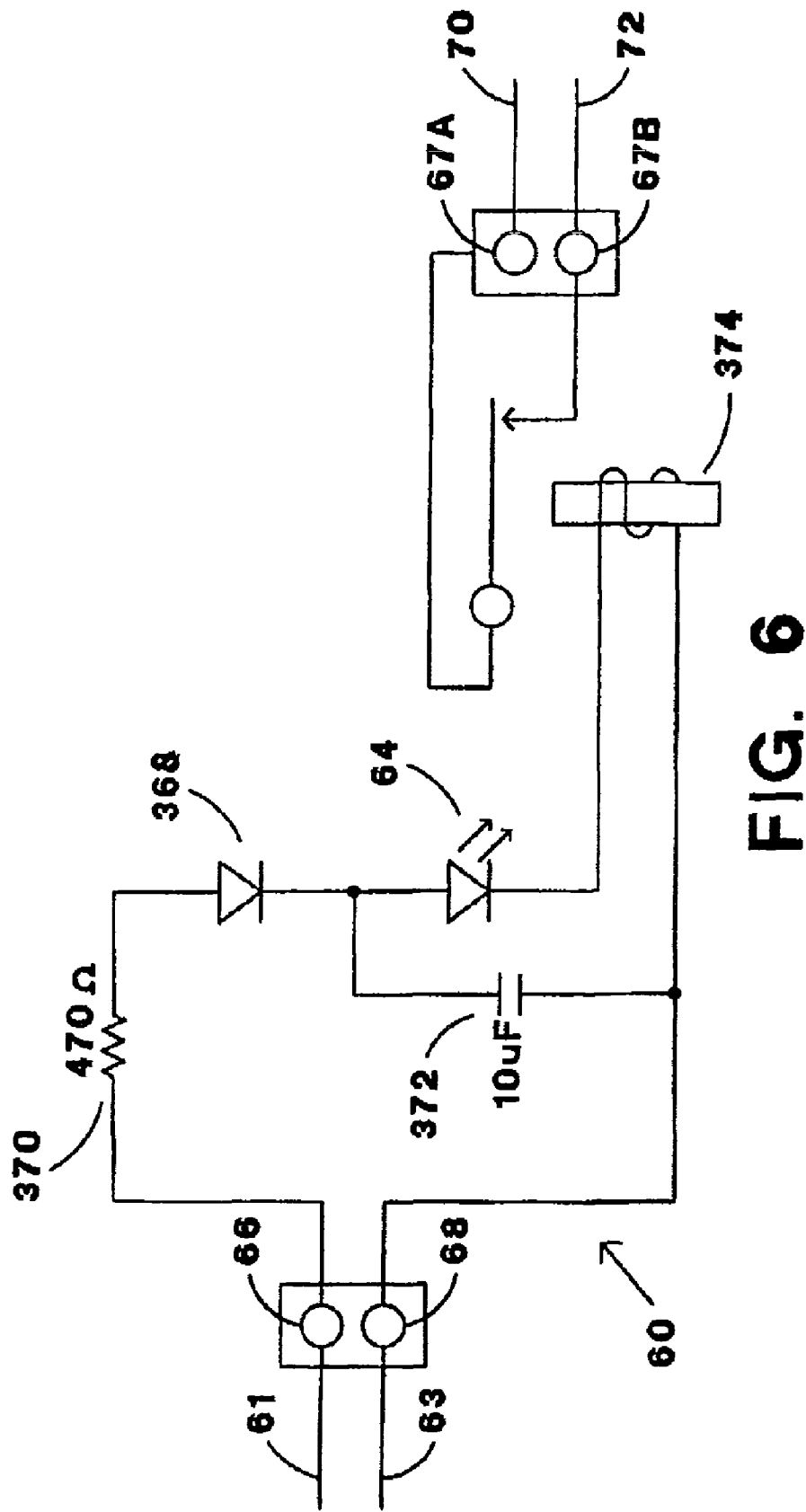
FIG. 6 is an electrical schematic diagram of a switch circuit including a relay, which is a portion of one embodiment of the present invention.

Referring to FIG. 6, an electrical schematic of a switch circuit 60 is shown. A voltage or current signal from the control panel 20 is provided to the input terminals 66 and 68 of the switch circuit 60. When a non-zero signal is received by the switch circuit 60 a light-emitting-diode 64 is illuminated to indicate that the switch circuit 60 is energized. A diode 368, a resistor 370 and a capacitor 372 rectify the signal received at input terminals 66 and 68 if it is an alternating signal. The voltage imposed across the capacitor 372 is the input to the direct current relay 374. If the signal received at input terminals 66 and 68 is a direct voltage or current signal, then the signal will also pass through to the relay 374. Accordingly, the switch circuit 360 is suitable to receive both an alternating signal or direct signal. The relay 374 is energized by a high voltage signal at the input terminals 66 and 68 and thereby its output contacts 67a and 67b are shorted. When the high voltage signal provided to the relay 374 is below a threshold level, the output contacts 67a and 67b to the relay 374 open, open-circuiting the output contacts 67a and 67b. The output contacts 67a and 67b are connected to the terminals 74 and 76 of a remotely located starter 22 (not shown) via wires 70 and 72 (FIG. 1). In other words, the starter 22 is spaced apart from the switch circuit 60.

Figure 7:
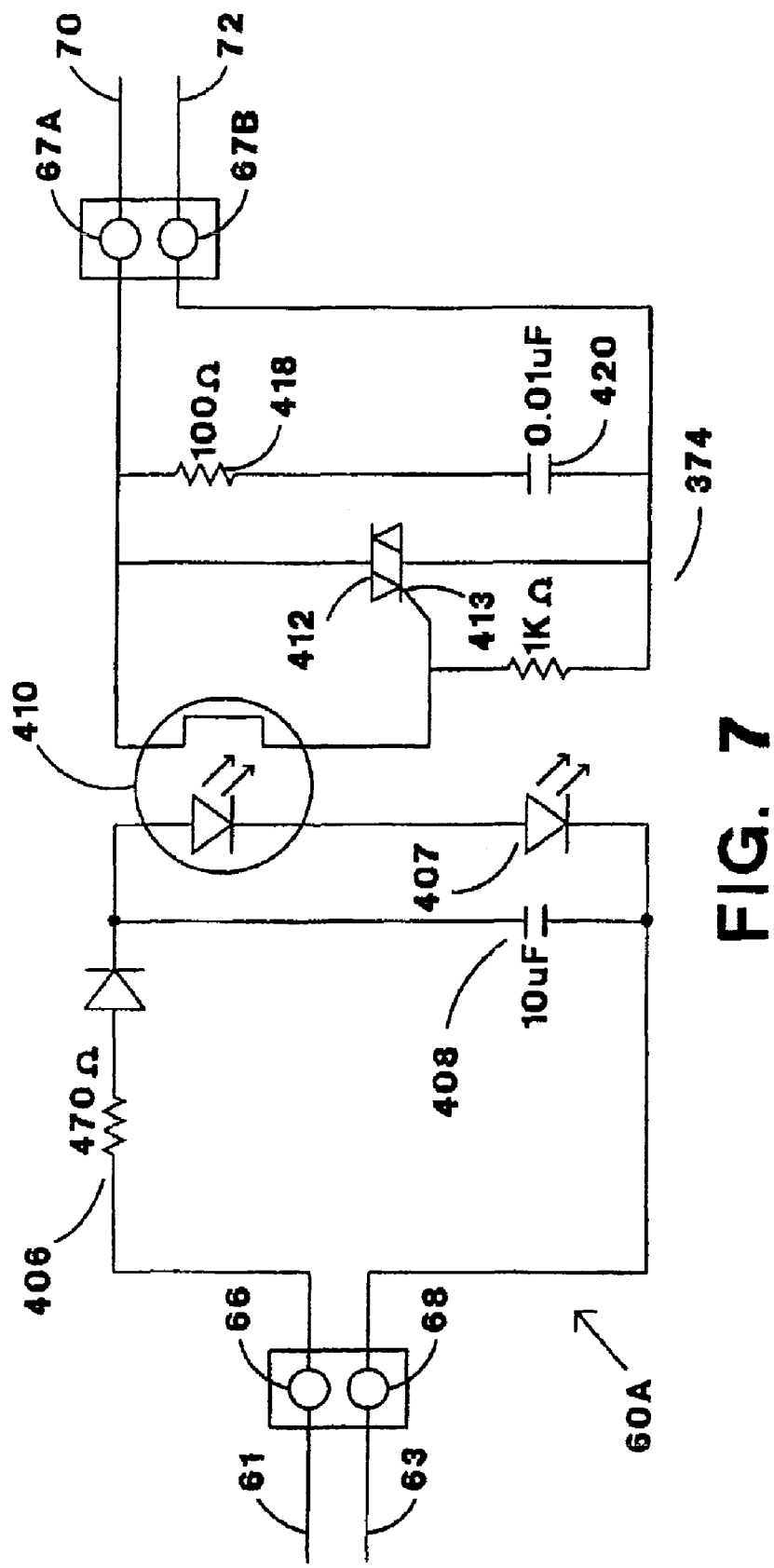
FIG. 7 is an electrical schematic diagram of a switch circuit including a triac, which is a portion of another embodiment of the present invention.

Referring to FIG. 7, an alternative switch circuit 60a includes a pair of input terminals 66 and 68, a resistor 406, a diode 407, and a capacitor 408 to permit the use of either an alternating signal or a direct signal as the input to the input terminals 66 and 68. An opto-isolator 410 isolates the high voltage to the input terminals 66 and 68 from the output terminals 67a and 67b for safety. A triac 412, which is a switching device, is energized with a low voltage on the gate 413 of the triac 412 to close the triac 412 creating a short circuit between the output terminals 67a and 67b. A "snubber circuit" includes a resistor 418 and capacitor 420 connected in parallel across the output terminals 67a and 67b. In general, the 'snubber circuit' prevents false triggering of the triac 412 that may occur when driving an inductive load. Output terminals 67a and 67b are thus short circuited or open circuited (by the operation of the triac 412) with the result that the terminals 67a and 67b exhibit a circuit condition to the starter 22 indicative of whether the electrical device 24 controlled by the starter 22 should be operating.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

We claim:

1. A protection device for monitoring current in a power cable to an electrical device and for controlling said electrical device in response to a system remotely located from said protection device, the protection device comprising:
   (a) a transformer magnetically linked with said power cable suitable for connection to said electrical device, said transformer producing an electrical signal at a pair of terminals thereof in response to the presence of a changing current within said power cable;
   (b) an input circuit electrically connected to said pair of terminals of said transformer and having an output terminal and being electrically connected to said transformer so as to be suitable for sensing said electrical signal, said input circuit producing, in response to sensing said electrical signal, one of a first signal representative of said changing current in said power cable at said output terminal of said input circuit, and a first circuit condition at said output terminal of said input circuit representative of said changing current in said power cable;
   (c) a switch circuit suitable for sensing one of a second signal and a second circuit condition of said remotely located system and providing one of a third signal and a third circuit condition, in response to sensing one of said second signal and said second circuit condition, said third signal and said third circuit condition suitable for being effective to control said electrical device when said electrical device is electrically connected thereto; and
   (d) said input circuit, said pair of terminals of said transformer, and said switch circuit being located within a single unitary package; wherein said input circuit is free from determining a value of power based upon said electrical signal.

2. The protection device of claim 1 wherein said transformer includes a wire-wrapped toroidal core at least partially encircling said power cable.

3. The protection device of claim 1 where said toroidal core has a low magnetic permeability.

4. The protection device of claim 1 wherein said first signal is a current signal.

5. The protection device of claim 4 wherein said current signal has a range of magnitude from about 4 ma to about 20 ma.

6. The protection device of claim 1 wherein said first signal is a voltage signal.

7. The protection device of claim 6 wherein said electrical signal has a range of magnitude from about 0 volts to about 5 volts.

8. The protection device of claim 1 wherein said first circuit condition is one of a short circuit and an open circuit.

9. The protection device of claim 1 wherein said system controller is a programmable logic device.

10. The protection device of claim 1 wherein said second signal is a direct current signal.

11. The protection device of claim 1 wherein said second signal is a alternating current signal.

12. The protection device of claim 1 wherein said second signal is a direct voltage signal.

13. The protection device of claim 1 wherein said second signal is an alternating voltage signal.

14. The protection device of claim 1 wherein said switch circuit includes a relay electrically connected to said system controller to sense said one of a second signal and second circuit condition.

15. The protection device of claim 1 wherein said switch circuit includes a triac electrically connected to said system controller to sense said one of a second signal and second circuit condition, and said transformer is located within said housing.

16. The protection device of claim 1 wherein said switch circuit includes an opto-isolator device.

17. The protection device of claim 1 wherein said switch circuit includes a rectifier circuit to rectify said second signal.

18. The protection device of claim 1 wherein said third circuit condition is a short circuit.

19. The protection device of claim 1 wherein said third circuit.

* * * * *